(12) United States Patent
Kim et al.

(10) Patent No.: US 7,886,957 B2
(45) Date of Patent: Feb. 15, 2011

(54) METHOD OF BONDING PROBES AND METHOD OF MANUFACTURING A PROBE CARD USING THE SAME

(75) Inventors: Ki-Joon Kim, Seoul (KR); Yong-Hwi Jo, Bucheon-si (KR)

(73) Assignee: Phicom Corporation, Seoul (KR)

( * ) Notice: Subject to any disclaimer, the term of this patent is extended or adjusted under 35 U.S.C. 154(b) by 316 days.

(21) Appl. No.: 12/097,839

(22) PCT Filed: Mar. 19, 2007

(86) PCT No.: PCT/KR2007/001322

§ 371 (c)(1),
(2), (4) Date: Jun. 17, 2008

(87) PCT Pub. No.: WO2007/119930

PCT Pub. Date: Oct. 25, 2007

(65) Prior Publication Data

US 2008/0290139 A1 Nov. 27, 2008

(30) Foreign Application Priority Data

Apr. 17, 2006 (KR) ...................... 10-2006-0034597

(51) Int. Cl.
*B23K 31/02* (2006.01)
(52) U.S. Cl. ................. 228/180.22; 228/215; 228/248.1
(58) Field of Classification Search ........................ None
See application file for complete search history.

(56) References Cited

U.S. PATENT DOCUMENTS 5,346,118 A * 9/1994 Degani et al. .......... 228/180.22
5,349,500 A * 9/1994 Casson et al. ............... 361/749
5,447,264 A 9/1995 Koopman et al.

(Continued)

FOREIGN PATENT DOCUMENTS

JP 08-264916 10/1996

(Continued)

OTHER PUBLICATIONS

German Office Action dated Aug. 17, 2009 for counterpart of German Patent Application No. 112007000256.5.

(Continued)

*Primary Examiner*—Kiley Stoner
(74) *Attorney, Agent, or Firm*—Daly, Crowley, Mofford & Durkee, LLP

(57) ABSTRACT

In a method of manufacturing bonding probes, bump layer patterns are formed on terminals of a multi-layered substrate. A first wetting layer pattern having a wettability with respect to a solder paste, and a non-wetting layer pattern having a non-wettability with respect to the solder paste are formed on the bump layer patterns. The solder paste is formed on the first wetting layer and the non-wetting layer pattern. The probes, which make contact with an object, are bonded to the solder paste. The solder paste on the non-wetting layer pattern reflows along a surface of the first wetting layer pattern to form an adhesive layer on the first wetting layer pattern. Thus, a sufficient amount of the solder paste, which is required for bonding the probes, may be provided to firmly bond the probes.

9 Claims, 3 Drawing Sheets

U.S. PATENT DOCUMENTS

| | | | |
|---|---|---|---|
| 5,983,493 A * | 11/1999 | Eldridge et al. | 29/855 |
| 6,044,548 A * | 4/2000 | Distefano et al. | 29/840 |
| 6,409,073 B1 | 6/2002 | Kaskoun et al. | |
| 6,545,229 B1 * | 4/2003 | Ma et al. | 174/263 |
| 6,552,555 B1 * | 4/2003 | Nuytkens et al. | 324/754 |
| 6,593,545 B1 | 7/2003 | Greenwood et al. | |
| 6,867,123 B2 * | 3/2005 | Katagiri et al. | 438/614 |
| 7,456,092 B2 * | 11/2008 | Hantschel et al. | 438/618 |
| 2001/0040297 A1 * | 11/2001 | Yoon et al. | 257/774 |
| 2002/0027444 A1 | 3/2002 | Jones et al. | |
| 2002/0094672 A1 * | 7/2002 | Holcombe | 438/613 |
| 2002/0142509 A1 * | 10/2002 | Hattori et al. | 438/52 |
| 2004/0171043 A1 * | 9/2004 | Takada | 435/6 |
| 2006/0006480 A1 | 1/2006 | Shinozaki et al. | |
| 2006/0022690 A1 * | 2/2006 | Malantonio et al. | 324/754 |
| 2008/0105355 A1 * | 5/2008 | Kumar et al. | 156/60 |

FOREIGN PATENT DOCUMENTS

| | | |
|---|---|---|
| KR | 1019990082735 A | 11/1999 |

OTHER PUBLICATIONS

PCT/KR2007/001322, PCT International Search Report, Date of Mailing Jun. 27, 2007, Applicant's Reference MX4301PC.

PCT/KR2007/001322, PCT Written Opinion of the International Searching Authority, Date of Mailing Jun. 27, 2007, Applicant's Reference MX4301PC.

English Abstract and JP Application No. 11-317227, Aug. 11, 1999, Sony Corp.

* cited by examiner

[Fig. 1]
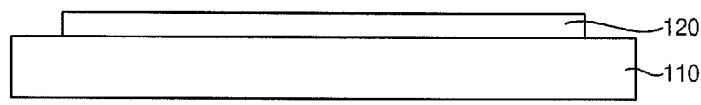
[Fig. 2]
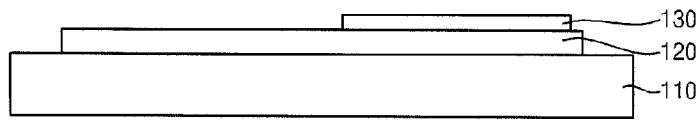
[Fig. 3]
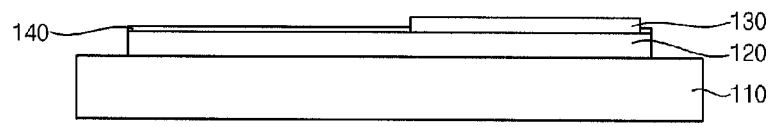
[Fig. 4]
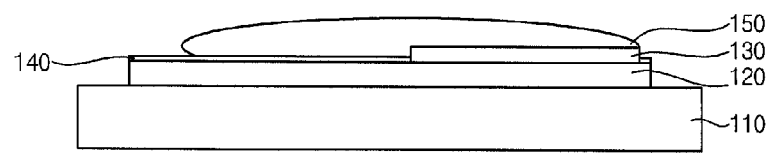
[Fig. 5]
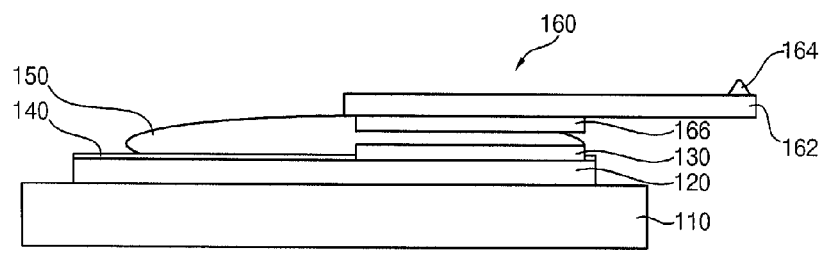
[Fig. 6]
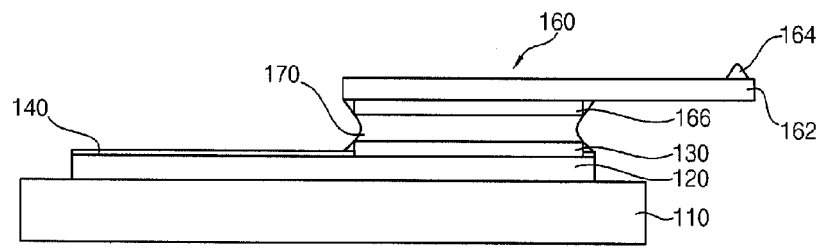
[Fig. 7]
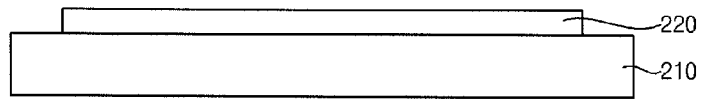

[Fig. 8]
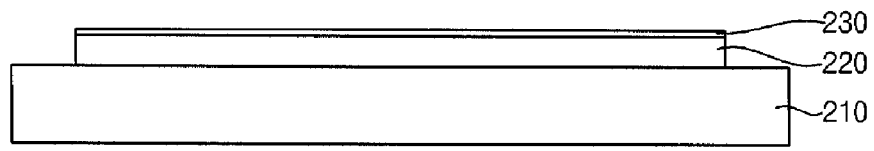
[Fig. 9]
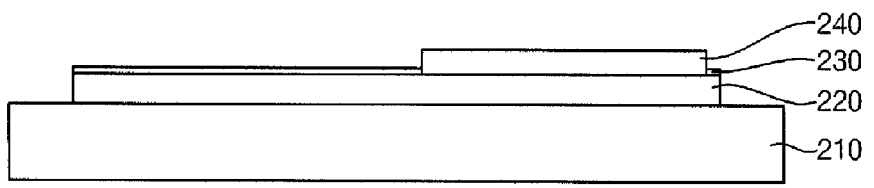
[Fig. 10]
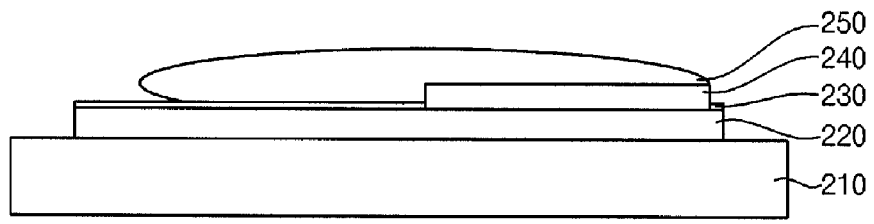
[Fig. 11]
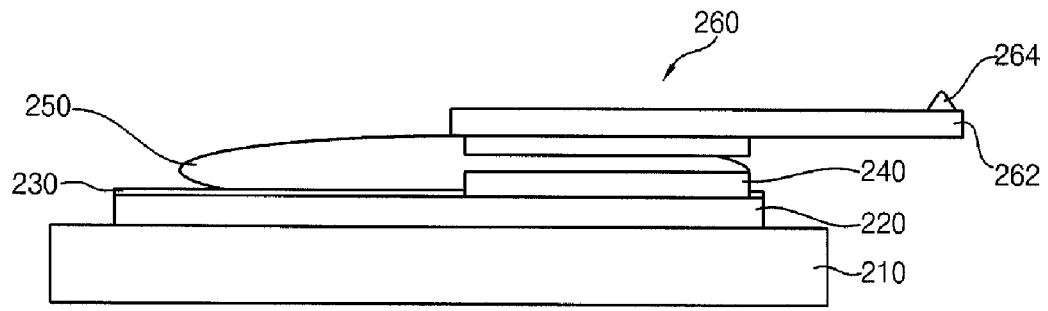
[Fig. 12]
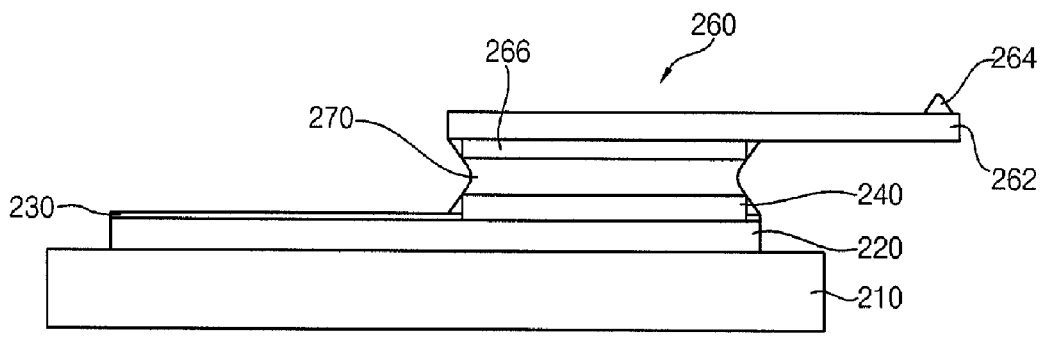

[Fig. 13]
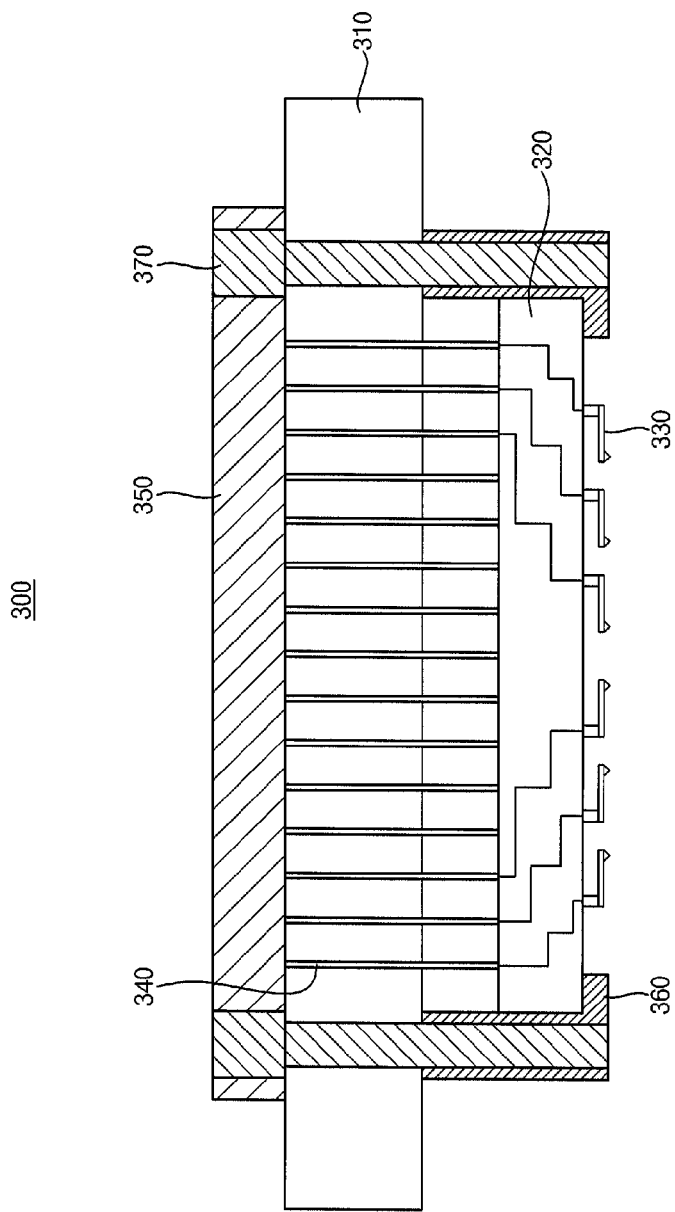
[Fig. 14]
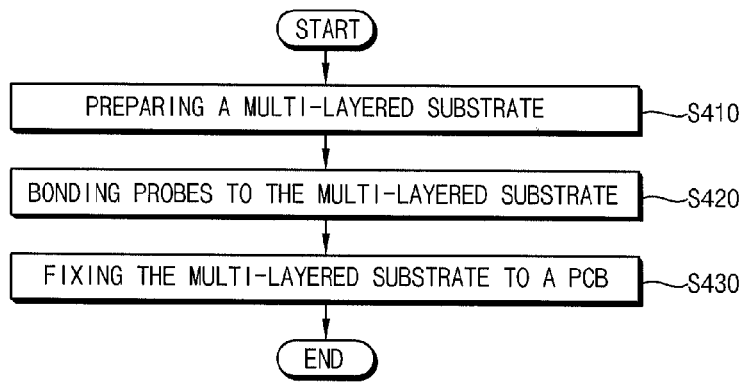

METHOD OF BONDING PROBES AND METHOD OF MANUFACTURING A PROBE CARD USING THE SAME

CROSS-REFERENCE TO RELATED APPLICATIONS

This application is a U.S. National Stage application of and claims the benefit of International Patent Application No. PCT/KR2007/001322, filed on Mar. 19, 2007, published in the English language as WO2007/119930 A1, which application claims priority from Korean Application No. 10-2006-0034597, filed on Apr. 17, 2006, which is hereby incorporated by reference.

TECHNICAL FIELD

Example embodiments of the present invention relate to a method of bonding probes and a method of manufacturing a probe card using the same. More particularly, example embodiments of the present invention relate to a method of bonding probes, which directly make contact with an object, to a multi-layered substrate, and a method of manufacturing a probe card using the method of bonding probes.

BACKGROUND ART

Generally, a probe card tests electrical capacities of a chip on a semiconductor substrate. The probe card makes contact with pads of the chip. The probe card then applies an electrical signal to the pads. The probe card detects a responsive electrical signal from the pads to determine whether operations of the chip are normal or not.

As a semiconductor device has been highly integrated, a circuit pattern of the semi-conductor device has been fined. Thus, it is required to manufacture the probe card having a pitch that corresponds to a pitch of the minute circuit pattern of the semi-conductor device.

Generally, the probe card may be manufactured by bonding a plurality of probes to a bump layer pattern on a multi-layered substrate using a solder paste. The solder paste may be coated by a screen-printing process using a stencil mask. According to the screen-printing process, a pattern is formed on the stencil mask by a laser process, an etching process, an electroplating process, etc. The solder paste passes through the pattern on the stencil mask to coat the solder paste. Here, examples of conventional method for forming a probe card are disclosed in Korean Patent Laid-Open Publication Nos. 2005-109331, 2004-88947, etc.

Here, when a pitch of the bump layer pattern is narrow, an area of the bump layer pattern on which the solder paste is coated may be narrow. Accordingly, an amount of the solder paste may be lack so that a bonding strength between the probe and the bump layer pattern may be weakened. To coat a sufficiently amount of the solder paste on the bump layer pattern having the fine pitch, it is required to increase a thickness of the stencil mask having the fine pattern. However, since the pattern has a small size and the stencil mask also has a thick thickness, the solder paste may not effectively pass through the thick stencil mask. As a result, although the stencil mask is provided with the thick thickness, an amount of the solder paste may be still lack. Further, the solder paste having a tall height may spread due to a gravity force of the probe. The spreading solder paste may cause an electrical short between the adjacent bump layer patterns.

Therefore, according to the conventional method, a sufficient amount of the solder paste, which is required for bonding the probe, may not be coated on the bump layer pattern. In contrast, although a sufficient amount of the solder paste may be coated on the bump layer pattern, the adjacent bump layer patterns may be electrically connected to each other through the spreading solder paste due to the gravity force of the probe.

DISCLOSURE OF INVENTION

Technical Problem

Example embodiments of the present invention provide a method of bonding probes that is capable of preventing an electrical short between bump layer patterns caused by a solder paste along with the solder paste that are sufficiently supplied.

Example embodiments of the present invention also provide a method of manufacturing a probe card using the above-mentioned method.

Technical Solution

In a method of bonding probes in accordance with one aspect of the present invention, bump layer patterns are formed on terminals of a multi-layered substrate. A first wetting layer pattern having a wettability with respect to a solder paste, and a non-wetting layer pattern having a non-wettability with respect to the solder paste are formed on the bump layer patterns. The solder paste is formed on the first wetting layer and the non-wetting layer pattern. The probes, which make contact with an object, are bonded to the solder paste. The solder paste on the non-wetting layer pattern reflows along a surface of the first wetting layer pattern to form an adhesive layer on the first wetting layer pattern.

According to one example embodiment, a second wetting layer pattern may be further formed on the probes bonded to the solder paste.

According to another example embodiment, forming the first wetting layer pattern and the non-wetting layer pattern may include forming the non-wetting layer pattern on a first region of the bump layer patterns; and forming the first wetting layer pattern on a second region of the non-wetting layer pattern that corresponds to a region, excluding for the first region from an entire region.

According to another example embodiment, forming the first wetting layer pattern and the non-wetting layer pattern may include forming the non-wetting layer pattern on an entire surface of the bump layer patterns, and partially forming the first wetting layer pattern on the non-wetting layer pattern.

According to still another example embodiment, the non-wetting layer pattern may include an oxide layer pattern.

In a method of manufacturing a probe card in accordance with another aspect of the present invention, a multi-layered substrate is prepared. Bump layer patterns are formed on terminals of the multi-layered substrate. A first wetting layer pattern having a wettability with respect to a solder paste, and a non-wetting layer pattern having a non-wettability with respect to the solder paste are formed on the bump layer patterns. The solder paste is formed on the first wetting layer and the non-wetting layer pattern. The probes, which make contact with an object, are bonded to the solder paste. The solder paste on the non-wetting layer pattern reflows along a surface of the first wetting layer pattern to form an adhesive layer on the first wetting layer pattern, thereby bonding the probes to the multi-layered substrate. The multi-layered substrate to which the probes are bonded is assembled with a printed circuit board to electrically connect the multi-layered substrate to the printed circuit board.

Advantageous Effects

According to the present invention, the solder paste is formed on the first wetting layer pattern and the non-wetting layer pattern. Thus, a sufficient amount of the solder paste, which is required for bonding the probes, may be provided without an electrical short between the adjacent bump layer patterns. Further, the solder paste reflows along the surface of the first wetting layer pattern based on a difference between wettability degrees of the first wetting layer pattern and the non-wetting layer pattern so that the probes may be firmly bonded using the solder paste.

BRIEF DESCRIPTION OF THE DRAWINGS

The above and other features and advantages of the invention will become readily apparent by reference to the following detailed description when considered in conjunction with the accompanying drawings wherein:

FIGS. 1 to 6 are cross-sectional views illustrating a method of bonding probes in accordance with a first example embodiment of the present invention;

FIGS. 7 to 12 are cross-sectional views illustrating a method of bonding probes in accordance with a second example embodiment of the present invention;

FIG. 13 is a cross-sectional view illustrating a probe card in accordance with a third example embodiment of the present invention; and FIG. 14 is a flow chart illustrating a method of manufacturing the probe card in FIG. 13.

BEST MODE FOR CARRYING OUT THE INVENTION

It should be understood that the example embodiments of the present invention described below may be modified in many different ways without departing from the inventive principles disclosed herein, and the scope of the present invention is therefore not limited to these particular following embodiments. Rather, these embodiments are provided so that this disclosure will be through and complete, and will fully convey the concept of the invention to those skilled in the art by way of example and not of limitation.

Hereinafter, the present invention will be described in detail with reference to the accompanying drawings.

Embodiment 1

FIGS. 1 to 6 are cross-sectional views illustrating a method of bonding probes in accordance with a first example embodiment of the present invention.

Referring to FIG. 1, a first photoresist film (not shown) is formed on a multi-layered substrate 110 on which circuit patterns are formed. The first photoresist film is exposed to form a first photoresist pattern (not shown) for forming a bump layer. Here, terminals (not shown) on the multi-layered substrate 110 are exposed through the first photoresist pattern. The bump layer (not shown) is formed on the first photoresist pattern to cover the terminals. For example, the bump layer includes a metal layer such as a nickel layer. Further, the bump layer may be formed by an electroplating process, a chemical vapor deposition (CVD) process, etc.

The bump layer is then partially removed by a chemical mechanical polishing (CMP) process, an etch-back process, etc., until a surface of the first photoresist pattern is exposed to form a bump layer pattern 120. The bump layer pattern 120 makes contact with the terminals. For example, the bump layer pattern 120 has a rectangular shape having a short axis and a long axis. Further, the long axis may be much longer than the short axis.

Referring to FIG. 2, a second photoresist film (not shown) is formed on the first photoresist pattern and the bump layer pattern 120. The second photoresist film is exposed to form a second photoresist pattern (not shown) for forming a first wetting layer. Here, a first region of the bump layer pattern 120 is exposed through the second photoresist pattern. A first wetting layer (not shown) is formed on the second photoresist pattern to cover the first region of the bump layer pattern 120. Here, the first wetting layer has a high wettability with respect to a solder paste 150 illustrated later. Thus, the solder paste 150 on the first wetting layer may readily spread. Further, the first wetting layer has non-oxidation reactivity. Thus, the first wetting layer may not be oxidized. For example, the first wetting layer includes a metal layer such as a gold layer having the wettability and the non-oxidation reactivity. Alternatively, the first wetting layer may include a double-layered structure that has a first metal layer having the wettability and a second metal layer having the non-oxidation reactivity. Here, an example of the first metal layer may include a copper layer, and an example of the second metal layer may include a gold layer. Further, the first wetting layer may be formed by an electroplating process, a CVD process, etc.

The first wetting layer is then removed by a CMP process, an etch-back process, etc., until a surface of the second photoresist pattern is exposed to form a first wetting layer pattern 130. The first wetting layer pattern 130 is placed on only the first region of the bump layer pattern 120. The first photoresist pattern and the second photoresist pattern are then removed by an ashing process and/or a stripping process.

Referring to FIG. 3, a non-wetting layer pattern 140 is formed on a second region of the bump layer pattern 120 that corresponds to a remaining region of the bump layer pattern 120, excluding for the first region. Here, then on-wetting layer pattern 140 has a low wettability with respect to the solder paste 150. Thus, the solder paste 150 on the non-wetting layer pattern 140 may not readily spread. In this example embodiment, an example of the non-wetting layer pattern 140 may include an oxide layer. The oxide layer may be formed by thermally oxidizing the bump layer pattern 120. The thermal oxidation process may be carried out by heating the bump layer pattern 120 and by applying a source gas to the heated bump layer pattern 120. Alternatively, the oxide layer may be formed by wet-oxidizing the bump layer pattern 120. The wet oxidation process may be carried out by applying an oxidation solution to the bump layer pattern 120. Here, since the first wetting layer pattern 130 has the non-oxidation reactivity, the non-wetting layer pattern 140 may not be formed on the first wetting layer pattern 130.

Referring to FIG. 4, the solder paste 150 is formed on the first wetting layer pattern 130 and the non-wetting layer pattern 140. In this example embodiment, the solder paste 150 may be formed using a stencil mask. Here, since the solder paste 150 is formed on the first wetting layer pattern 130 and the non-wetting layer pattern 140, and the bump layer pattern 120 on which the first wetting layer pattern 130 and the non-wetting layer pattern 140 are formed has the long rectangular shape, a coated area of the solder paste 150 may relatively expand. Accordingly, a sufficient amount of the solder paste 150 may be formed. Further, it may not be required to increase a thickness of the stencil mask in order to increase an amount of the solder paste 150. Thus, since the stencil mask having a thin thickness is available, the sufficient amount of the solder paste 150 may readily pass through the thin stencil mask.

Referring to FIG. 5, a probe 160 directly making contact with an object is bonded to the solder paste 150. In this example embodiment, the probe 160 may include a cantilever-type probe. The probe 160 includes a support beam 162, a tip 164 and a second wetting layer pattern 166.

The support beam 162 has a first end fixed to the solder paste 150 to be arranged substantially in parallel with the multi-layered substrate 110. Here, the support beam 162 may be fixed to the entire solder paste 150 on the first wetting layer pattern 130 and the non-wetting layer pattern 140. Alternatively, the support beam 162 may be fixed to only the solder paste 150 on the first wetting layer pattern 130. The tip 162 is protruded from a second end of the support beam 162 opposite to the first end. The second wetting layer pattern 166 is formed on a surface of the support beam 162 where the solder paste 150 is bonded. In this example embodiment, the second wetting layer pattern 166 may be arranged corresponding to first wetting layer pattern 130. The second wetting layer pattern 166 has the wettability and the non-oxidation reactivity substantially similar to those of the first wetting layer pattern 130.

Referring to FIG. 6, the multi-layered substrate 110 to which the probe 160 is bonded is heated to a temperature for allowing the solder paste 150 to reflow. Since the first wetting layer pattern 130 has the wettability greater than that of the non-wetting layer pattern 140, the solder paste 150 on the non-wetting layer pattern 140 reflows toward a surface of the first wetting layer pattern 130 due to a surface tension of the solder paste 150. Further, since the second wetting layer pattern 166 is positioned on the solder paste 150 that corresponds to the first wetting layer pattern 130, the solder paste 150 on the non-wetting layer pattern 140 may more readily reflow toward the surface of the first wetting layer pattern 130. The solder paste 150 reflowing between the first wetting layer pattern 130 and the second wetting layer pattern 166 is hardened to form an adhesive layer 170. Further, a fillet is formed along edges of the first wetting layer pattern 130 and the second wetting layer pattern 166. Here, when the fillet on the edges of the first wetting layer pattern 130 is excluded from the adhesive layer 170, the adhesive layer 170 may have an area substantially the same as that of the first wetting layer pattern 130. Thus, the sufficient amount of the solder paste 150 for forming the adhesive layer 170 is used so that the adhesive layer 170 may firmly secure the probe 160.

According to this example embodiment, the solder paste 150 may not cause an electrical short between the adjacent bump layer patterns 120 having a minute pitch. Further, the probe 160 may be firmly secured to the bump layer pattern 120.

Embodiment 2

FIGS. 7 to 12 are cross-sectional views illustrating a method of bonding probes in accordance with a second example embodiment of the present invention.

Referring to FIG. 7, a first photoresist film (not shown) is formed on a multi-layered substrate 210 on which circuit patterns are formed. The first photoresist film is exposed to form a first photoresist pattern (not shown) for forming a bump layer. Here, terminals (not shown) on the multi-layered substrate 210 are exposed through the first photoresist pattern. The bump layer (not shown) is formed on the first photoresist pattern to cover the terminals. For example, the bump layer includes a metal layer such as a nickel layer. Further, the bump layer may be formed by an electroplating process, a chemical vapor deposition (CVD) process, etc.

The bump layer is then partially removed by a chemical mechanical polishing (CMP) process, an etch-back process, etc., until a surface of the first photoresist pattern is exposed to form a bump layer pattern 220. The bump layer pattern 220 makes contact with the terminals. The first photoresist pattern is then removed by an ashing process and/or a stripping process.

Referring to FIG. 8, a non-wetting layer pattern 230 is formed on the bump layer pattern 220. Here, the non-wetting layer pattern 230 has a low wettability with respect to a solder paste 250. Thus, the solder paste 250 on the non-wetting layer pattern 230 may not readily spread. In this example embodiment, an example of the non-wetting layer pattern 230 may include an oxide layer. The oxide layer may be formed by thermally oxidizing or wet-oxidizing the bump layer pattern 220.

Referring to FIG. 9, a second photoresist film (not shown) is formed on the multi-layered substrate 210 and the non-wetting layer pattern 230. The second photoresist film is exposed to form a second photoresist pattern (not shown) for forming a first wetting layer. Here, a first region of the non-wetting layer pattern 230 is exposed through the second photoresist pattern. The first region of the non-wetting layer pattern 230 is etched using the second photoresist pattern as an etching mask to partially expose the bump layer pattern 220. In this example embodiment, the first region of the non-wetting layer pattern 230 may be etched by a wet etching process.

A first wetting layer (not shown) is formed on the second photoresist pattern to cover the exposed bump layer pattern 220. Here, the first wetting layer has a high wettability with respect to the solder paste 250. Thus, the solder paste 250 on the first wetting layer may readily spread. Further, the first wetting layer has a non-oxidation reactivity. Thus, the first wetting layer may not be oxidized. For example, the first wetting layer includes a metal layer such as a gold layer having the wettability and the non-oxidation reactivity. Alternatively, the first wetting layer may include a double-layered structure that has a first metal layer having the wettability and a second metal layer having the non-oxidation reactivity. Here, an example of the first metal layer may include a copper layer, and an example of the second metal layer may include a gold layer. Further, the first wetting layer may be formed by an electroplating process, a CVD process, etc.

The first wetting layer is then removed by a CMP process, an etch-back process, etc., until a surface of the second photoresist pattern is exposed to form a first wetting layer pattern 240. The first wetting layer pattern 240 is partially placed only on the bump layer pattern 220. The second photoresist pattern is then removed by an ashing process and/or a stripping process.

Referring to FIGS. 10 to 12, the solder paste 250 is formed on the first wetting layer pattern 240 and the non-wetting layer pattern 230. A probe 260 directly making contact with an object is bonded to the solder paste 250. The solder paste 250 reflows for allowing the solder paste 250 on the non-wetting layer pattern 240 to move toward a surface of the first wetting layer pattern 230, thereby forming an adhesive layer 270 between the first wetting layer pattern 230 and a second wetting layer pattern 266.

Here, processes in FIGS. 10 to 12 are substantially the same as those in FIGS. 4 to 6. Thus, any further illustrations with respect to the processes in FIGS. 10 to 12 are omitted herein for brevity.

Embodiment 3

FIG. 13 is a cross-sectional view illustrating a probe card in accordance with a third example embodiment of the present invention.

Referring to FIG. 13, a probe card 300 of this example embodiment includes a printed circuit board (PCB) 310, a multi-layered substrate 320, a probe 330, an interface pin 340, an upper support plate 350, a lower support plate and a fixing member 370.

The PCB 310 has a hole in communication with a circuit of the multi-layered substrate 320 and a circuit of the PCB 310. The multi-layered substrate 320 is arranged to be spaced apart from a lower face of the PCB 310. Further, the multi-layered substrate 320 is arranged substantially in parallel with the PCB 310. The probe 330 is electrically connected to a lower face of the multi-layered substrate 320.

The interface pin 340 is inserted into the hole of the PCB 310. The interface pin 340 has an elastic material. Further, the interface pin 310 is electrically connected between the PCB 310 and the multi-layered substrate 320. In this example embodiment, the interface pin 340 may include a pogo pin. The interface pin 340 may have an elastic member provided in the pogo pin. Therefore, the pogo pin may adjust an interval between the PCB 310 and the multi-layered substrate 320.

The upper support plate 350 is located on an upper face of the PCB 310. The lower support plate 360 is placed on a lower face of the multi-layered substrate 320. The fixing member 370 secures the upper support plate 350 and the lower support plate 360 to the PCB 310 and the multi-layered substrate 320, respectively, to thereby separate the PCB 310 and the multi-layered substrate 320 from each other.

Further, the probe 330, the circuit of the multi-layered substrate 320, the interface pin 340 and the circuit of the PCB 310 are electrically connected to one another.

FIG. 14 is a flow chart illustrating a method of manufacturing the probe card in FIG. 13.

Referring to FIG. 14, in step S410, the multi-layered substrate 320 having the circuit is prepared.

In step S420, the probe 330 is bonded to the multi-layered substrate 320. Here, the probe 330 is placed on terminals of the multi-layered substrate 320.

Processes for bonding the probe 330 may be carried out in a manner substantially the same as that illustrated with reference to FIGS. 1 to 6. Thus, any further illustrations with respect to the processes for bonding the probe 330 are omitted herein for brevity.

In step S430, the interface pin 340 is inserted into the hole of the PCB 310. The multi-layered substrate 320 to which the probe 330 is bonded is positioned under the PCB 310 having the interface pin 340 to electrically connect the multi-layered substrate 320 to the interface pin 340. The upper support plate 350 is located on the upper face of the PCB 310. The lower support plate 360 is then placed on the lower face of the multi-layered substrate 320. The fixing member 370 fixes the upper support plate 350 and the lower support plate 360 to the PCB 310 and the multi-layered substrate 320, respectively, to thereby separate the PCB 310 and the multi-layered substrate 320 from each other.

INDUSTRIAL APPLICABILITY

According to the present invention, the solder paste is formed on the first wetting layer pattern and the non-wetting layer pattern formed on the bump layer pattern. Thus, a sufficient amount of the solder paste, which is required for bonding the probes, may be provided without an electrical short between the adjacent bump layer patterns.

Further, the solder paste reflows along the surface of the first wetting layer pattern to form the adhesive layer having a strong bonding strength. As a result, the probe card for accurately testing a semiconductor device that has a minute dimension may be manufactured.

The invention claimed is:

1. A method of bonding probes, comprising:
   forming bump layer patterns on terminals of a multi-layered substrate;
   forming a first wetting layer pattern and a non-wetting layer pattern on the bump layer patterns, the first wetting layer pattern having a wettability with respect to a solder paste, and the non-wetting layer pattern having a non-wettability with respect to the solder paste;
   forming the solder paste on the first wetting layer pattern and the non-wetting layer pattern;
   bonding the probes, which make contact with an object, to the solder paste; and
   reflowing the solder paste on the non-wetting layer pattern toward a surface of the first wetting layer pattern to form an adhesive layer on the first wetting layer pattern.

2. The method of claim 1, wherein further comprising forming a second wetting layer pattern on a surface of the probes to which the solder paste is bonded.

3. The method of claim 1, wherein the probes are bonded to the solder paste on the first wetting layer pattern.

4. The method of claim 1, wherein forming the first wetting layer pattern and the non-wetting layer pattern comprises:
   forming the the the first wetting layer pattern on a first region of the bump layer patterns; and
   forming the non-wetting layer pattern on a second region of the bump layer patterns that corresponds to a region, excluding the first region from an entire region.

5. The method of claim 1, wherein forming the first wetting layer pattern and the non-wetting layer pattern comprises:
   forming the non-wetting layer pattern on an entire surface of the bump layer patterns;
   partially removing the non-wetting layer pattern by an etching process, so that the bump layer patterns are partially exposed; and
   forming the first wetting layer pattern on the exposed bump layer patterns.

6. The method of claim 1, wherein the non-wetting layer pattern comprises an oxide layer pattern.

7. The method of claim 6, wherein the non-wetting layer pattern is formed by thermally oxidizing the bump layer pattern.

8. The method of claim 6, wherein the non-wetting layer pattern is formed by wet-oxidizing the bump layer pattern.

9. A method of manufacturing a probe card, comprising:
   preparing a multi-layered substrate;
   bonding probes to the multi-layered substrate; and
   assembling the multi-layered substrate with a printed circuit board for allowing the probes to be electrically connected to the printed circuit board,
   wherein bonding the probes to the multi-layered substrate comprises: forming bump layer patterns on terminals of the multi-layered substrate;
   forming a first wetting layer pattern and a non-wetting layer pattern on the bump layer patterns, the first wetting layer pattern having a wettability with respect to a solder paste, and the non-wetting layer pattern having a non-wettability with respect to the solder paste;
   forming the solder paste on the first wetting layer pattern and the non-wetting layer pattern;
   bonding the probes, which make contact with an object, to the solder paste; and reflowing the solder paste on the non-wetting layer pattern toward a surface of the first wetting layer pattern to form an adhesive layer on the first wetting layer pattern.

* * * * *